(12) United States Patent
Nakajima et al.

(10) Patent No.: US 6,186,389 B1
(45) Date of Patent: Feb. 13, 2001

(54) APPARATUS AND PROCESS FOR MOUNTING CONDUCTOR BALLS ON TERMINAL PADS OF SEMICONDUCTOR DEVICES

(75) Inventors: Kiyonori Nakajima, Nagano; Yoshiharu Fujimori, Suwa, both of (JP)

(73) Assignees: Shinko Electric Industries Co., Ltd.; Athlete FA Corporation, both of Nagano (JP)

( * ) Notice: Under 35 U.S.C. 154(b), the term of this patent shall be extended for 0 days.

(21) Appl. No.: 09/559,039

(22) Filed: Apr. 27, 2000

(30) Foreign Application Priority Data

Apr. 30, 1999 (JP) .................................. 11-124606
Jan. 6, 2000 (JP) ............................... 2000-000658

(51) Int. Cl.[7] .............................. B23K 1/00; B23K 35/12; B65H 3/60; B23Q 7/04
(52) U.S. Cl. .............................. 228/41; 228/33; 228/6.2; 228/7; 228/245; 228/246; 221/211
(58) Field of Search .............................. 228/41, 33, 245, 228/246, 253, 6.2, 180.21, 180.22, 7; 221/211; 29/879, 884

(56) References Cited

U.S. PATENT DOCUMENTS

| | | | |
|---|---|---|---|
| 5,114,878 | * | 5/1992 | Maruyama et al. . |
| 5,284,287 | * | 2/1994 | Wilson et al. . |
| 5,620,927 | * | 4/1997 | Lee . |
| 5,626,277 | * | 5/1997 | Kawada . |
| 5,749,614 | * | 5/1998 | Reid et al. . |
| 5,750,199 | * | 5/1998 | Sakemi . |
| 5,839,641 | * | 12/1998 | Teng . |
| 5,861,323 | * | 1/1999 | Hayes . |
| 5,890,283 | * | 4/1999 | Sakemi et al. . |
| 6,003,753 | * | 12/1999 | Hwang et al. . |
| 6,056,190 | * | 5/2000 | Foulke et al. . |
| 6,100,175 | * | 8/2000 | Wood et al. . |

FOREIGN PATENT DOCUMENTS

| | | |
|---|---|---|
| 3013528 | 5/1995 | (JP) . |
| 9-134923 | 5/1997 | (JP) . |

* cited by examiner

*Primary Examiner*—Patrick Ryan
*Assistant Examiner*—Colleen Cooke
(74) *Attorney, Agent, or Firm*—Pennie & Edmonds LLP

(57) ABSTRACT

An apparatus and a process for mounting solder balls or other conductor balls on terminal pads of semiconductor devices or other electronic devices collectively formed on a semiconductor wafer or other substrate by using a single adsorbing plate.

The apparatus includes an adsorbing unit which comprises an adsorbing head; an adsorbing plate attached to the head and having adsorbing holes for adsorbing the conductor balls, the adsorbing holes being arranged corresponding in number and position to the terminal pads present in one of the divisions that includes a largest number of the devices; and a mask plate attached to one side of the adsorbing plate and having an opening conformed in shape and size to an area of the substrate occupied by a group of the devices included in a selected one of the divisions so that the conductor balls are only adsorbed by the adsorbing holes corresponding in position to the terminal pads of the devices of the group in the selected one division.

7 Claims, 13 Drawing Sheets

Fig.5
(a)
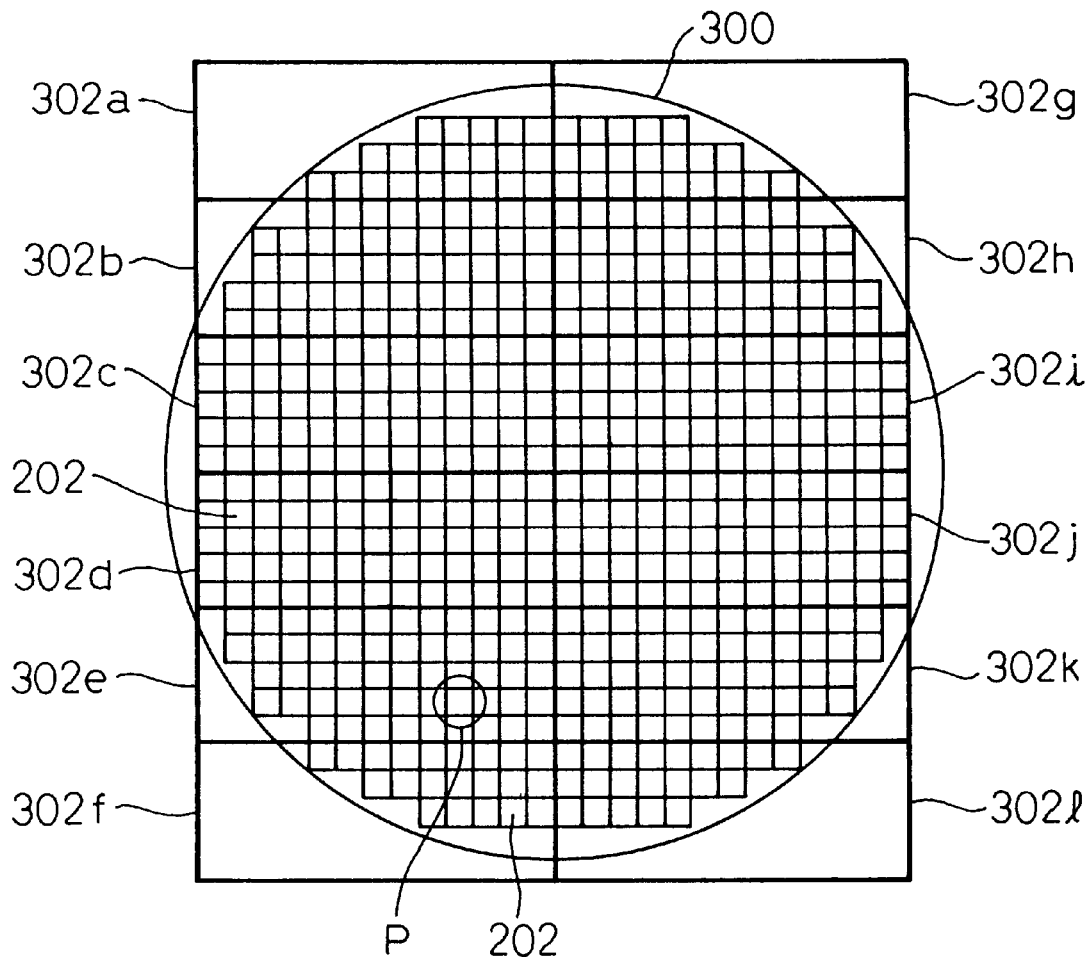
(b)
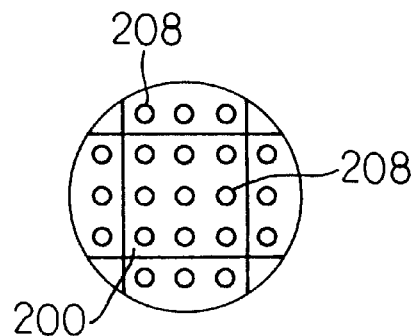

Fig.6
(a)
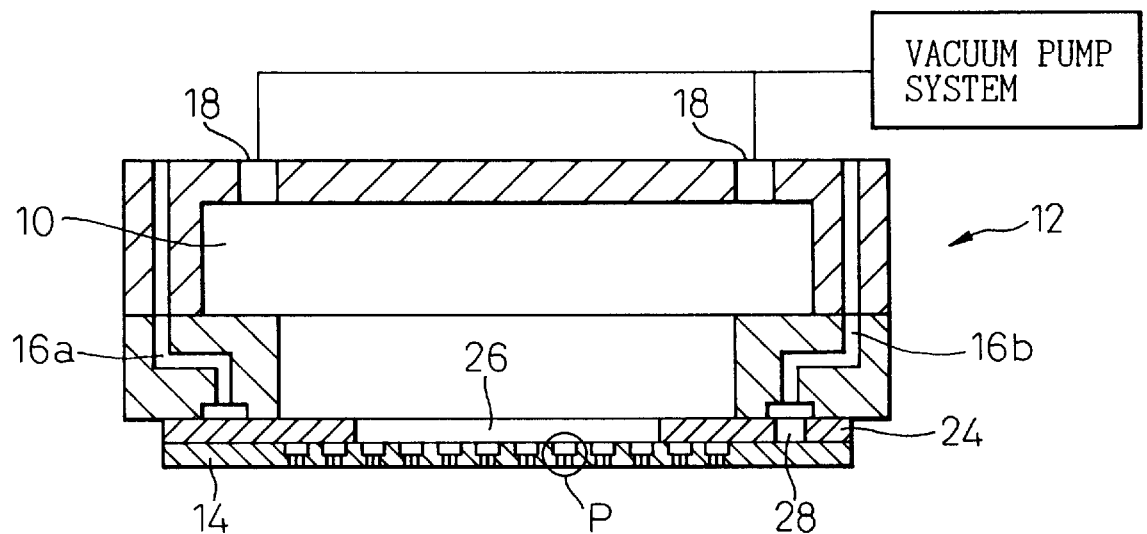
(b)
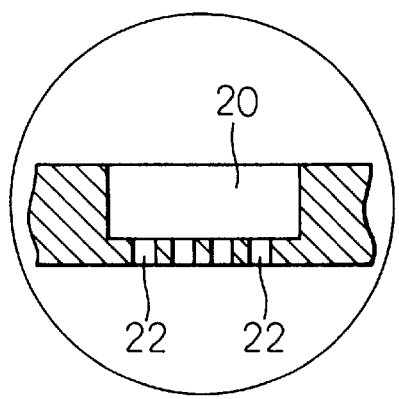

Fig. 7
(a)
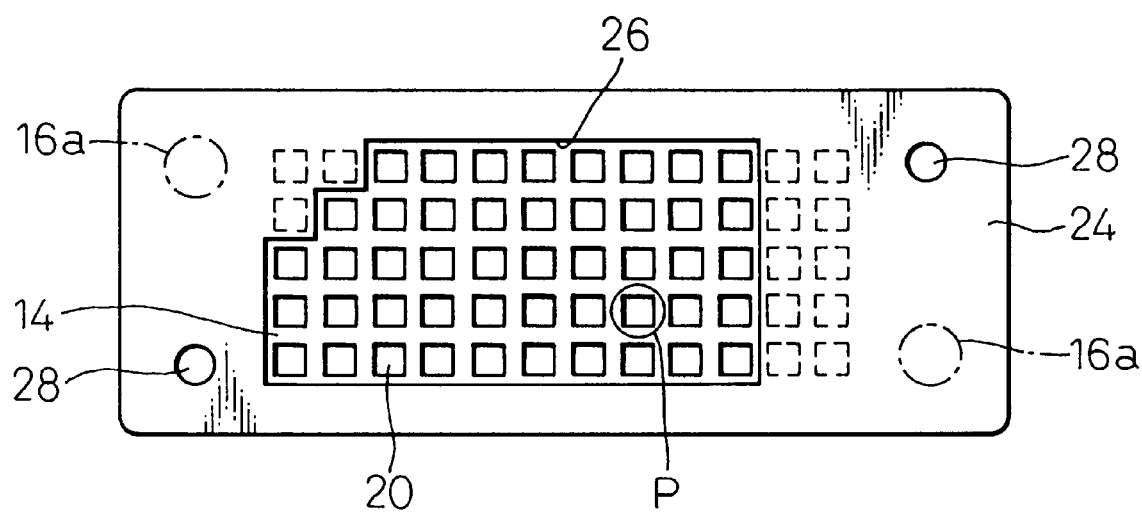
(b)
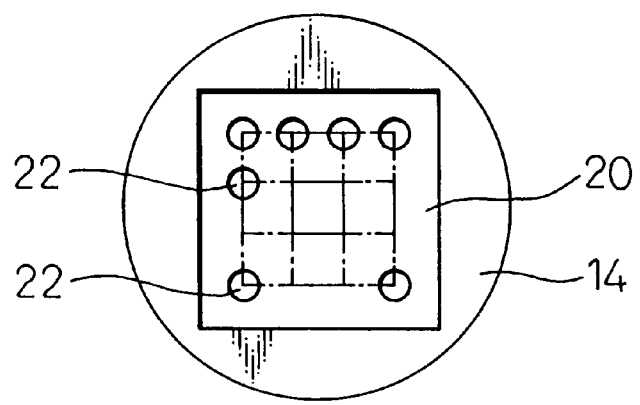

Fig.13
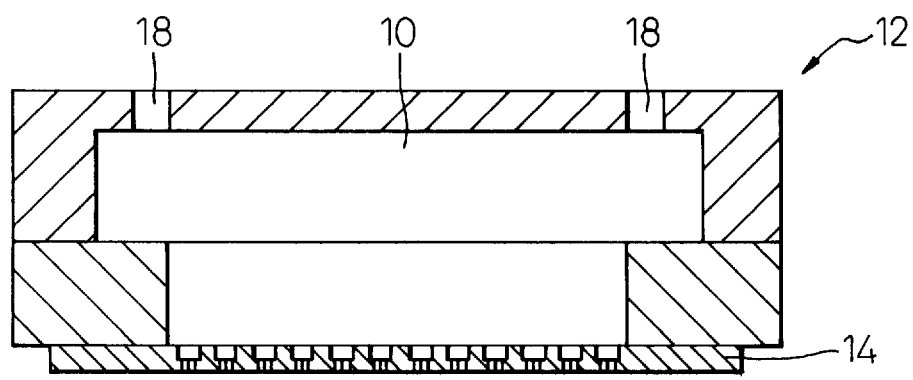
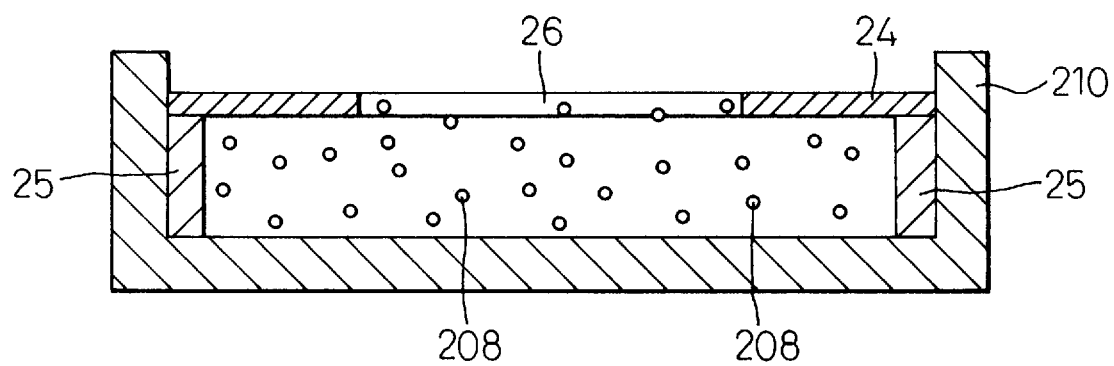

APPARATUS AND PROCESS FOR MOUNTING CONDUCTOR BALLS ON TERMINAL PADS OF SEMICONDUCTOR DEVICES

BACKGROUND OF THE INVENTION

1. Field of the Invention

The present invention relates to an apparatus and a process for mounting conductor balls, on terminal pads of semiconductor devices or other electronic devices collectively formed in a single semiconductor wafer or other substrate, stepwise for divisions of the substrate that include different numbers of the devices. The present invention also relates to an adsorbing unit advantageously used in the apparatus and a process and a mask plate suitably used in the adsorbing unit.

2. Description of the Related Art

FIG. 1 shows a conventional semiconductor device 100 of a BGA (ball grid array) type having ball form terminals or solder balls 110 bonded to terminal pads 108 to form external connection terminals on one side of a circuit board 102. The terminal pads 108 form one end of conductor wiring patterns 106 having the other ends wire-bonded to a semiconductor chip 104 on the other side of the circuit board 102.

To mount the solder balls 110 on the terminal pads 108, U.S. Pat. No. 5,284,287 discloses an adsorbing unit for adsorbing the solder balls 110 as shown in FIG. 2.

The adsorbing unit 100 includes an adsorbing plate 114 having adsorbing holes 112 penetrating therethrough at positions corresponding to the terminal pads 108 of the circuit board 102 and having a diameter smaller than that of the solder balls 110, in which the adsorbing plate 114 is connected to a vacuum pump system for evacuating the adsorbing holes 112 to adsorb the solder balls 110 at an open end thereof.

As shown in FIG. 3, the adsorbing holes 112 are evacuated to adsorb the solder balls 110 contained in a vessel 116 with one adsorbing hole 112 adsorbing one solder ball 110 and the adsorbing plate 114 is then moved to bring the adsorbed solder balls 110 into close contact to the corresponding terminal pads 108 where the adsorbing holes 112 are freed from evacuation to release the solder balls 110 onto the terminal pads 108, thereby mounting the solder balls 110 on the terminal pads 108.

As shown in FIG. 4, a chip size package (CSP) 200 has substantially the same size as the semiconductor chip 202 packaged therein and having on one side a conductor pattern 206 with one end electrically connected to an electrode terminal 204 of the chip and the other end forming a terminal pad on which a solder ball 208 is mounted to provide a ball-form external connection terminal. The conductor pattern 206 is formed on one side of a resin film 210. A resilient resin layer 212 is interposed between the conductor pattern 206 and the surface of the semiconductor chip 202, on which surface the electrode terminal 204 is formed, to absorb thermal stress generated by the different thermal expansion coefficients of the semiconductor chip 202 and a mother board on which the CSP 200 is mounted.

The above-mentioned end of the conductor pattern 206 connected to the electrode terminal 204 protrudes from an edge of the resin film 210 and is sealed or packaged with the electrode terminal 204 by a packaging resin 214.

The CSP 200 shown in FIG. 4 is smaller than the BGA type semiconductor device 100 shown in FIG. 1 and is manufactured, as shown in FIG. 5, by forming many CSPs 200 on many semiconductor elements formed in the wafer 300 and then dicing or cutting the wafer 300 into respective CSPs 200. FIG. 5(a) shows the whole area of the wafer 300 and FIG. 5(b) is an enlarged partial view showing the circled part P of the wafer 300.

Before dicing the wafer 300, the solder balls 208 are mounted on terminal pads of the above-formed semiconductor devices or CSPs 200. The solder balls 208 are mounted quickly by using the adsorbing unit shown in FIGS. 2 and 3.

The wafer 300 is imaginarily divided into plural divisions 302a to 302l having the same shape and size as that of the adsorbing plate 114 of the adsorbing unit and the mounting of the solder balls 208 is carried out division by division, because the adsorbing plate 114 has a limited actually producible size while ensuring the necessary flatness and other accuracies.

The wafer 300 includes twelve divisions 302a to 302l, in which four divisions 302c, 302d, 302i and 302j have an area occupied by a group of the semiconductor devices 200 (corresponding semiconductor elements 202 are shown in FIG. 5) that completely fills each of these four divisions, so that the device-occupied areas of these four divisions have the same shape and size, i.e., have a single pattern. In contrast, eight divisions 302a, 302b, 302e, 302f, 302g, 302h, 302k and 302l have an area occupied by the semiconductor devices 200 that incompletely fills each of these eight divisions, so that the device-occupied areas of these eight divisions are different in shape and size between divisions, i.e., have eight patterns.

To mount solder balls 208 on terminal pads of semiconductor devices 200 arranged in nine different patterns, it is necessary to prepare adsorbing plates 114 having adsorbing holes 112 arranged in nine different patterns.

The adsorbing plate 114 is very expensive to produce and the cost of producing semiconductor devices is significantly raised by preparing various types of adsorbing plates.

The adsorbing unit shown in FIGS. 2 and 3 also has a drawback in that the adsorbing plate 114 is fixed to the unit body and exchange of the adsorbing plate 114 is not possible, so that it is extremely difficult, or actually impossible, to quickly mount solder balls 208 on the desired terminal pads with quickly exchanging adsorbing plates 114.

SUMMARY OF THE INVENTION

The object of the present invention is to provide an apparatus and a process for mounting solder balls or other conductor balls on terminal pads of semiconductor devices or other electronic devices collectively formed on a semiconductor wafer or other substrate by using a single adsorbing plate.

The semiconductor wafer shown in FIG. 5 has divisions 302a to 302l in which the semiconductor devices 200 are common to each other in the pitch of terminal pads or other parameters except for the area occupied by the devices 200 that are different between divisions.

Therefore, quick mounting of conductor balls on terminal pads division by division, or stepwise for divisions, by using a single adsorbing plate can be achieved, according to the present invention, by using a mask plate having adsorbing holes arranged corresponding in number and position to the terminal pads of the devices present in the division 302c, 302d, 302i or 302j that includes a largest number of the devices and partially masking the adsorbing plate with a mask plate having an opening conformed in shape and size to the device-occupied area of the other divisions, while exchanging the mask plate with another, between divisions, having the device-occupied areas different in shape and size from each other.

According to the first aspect, the present invention provides an apparatus for mounting conductor balls on terminal pads of semiconductor devices or other electronic devices on a semiconductor wafer or other substrate, stepwise, for divisions of the substrate that include different numbers of the devices, the apparatus including an adsorbing unit which comprises:

an adsorbing head;

an adsorbing plate attached to the head and having adsorbing holes for adsorbing the conductor balls, the adsorbing holes being arranged corresponding in number and position to the terminal pads present in one of the divisions that includes a largest number of the devices; and a mask plate attached to one side of the adsorbing plate and having an opening conformed in shape and size to an area of the substrate occupied by a group of the devices included in a selected one of the divisions so that the conductor balls are only adsorbed by the adsorbing holes corresponding in position to the terminal pads of the devices of the group in the selected one division.

According to the second aspect, the present invention provides an apparatus for mounting conductor balls on terminal pads of semiconductor devices or other electronic devices on a semiconductor wafer or other substrate, stepwise, for divisions of the substrate that include different numbers of the devices, the apparatus including an adsorbing unit which comprises:

an adsorbing head;

an adsorbing plate attached to the head and having adsorbing holes for adsorbing the conductor balls, the adsorbing holes being arranged corresponding in number and position to the terminal pads present in one of the divisions that includes a largest number of the devices;

a vessel for containing the conductor balls and having an open end for allowing the conductor balls to enter and exit the vessel;

a mask plate attached to the open end of the vessel and having an opening conformed in shape and size to an area of the substrate occupied by a group of the devices included in a selected one of the divisions; and a means for moving the head to bring the adsorbing plate into close contact with, or away from, the mask plate so that the conductor balls are only adsorbed by the adsorbing holes corresponding in position to the terminal pads of the devices of the group in the selected one division when the head is moved to bring the adsorbing plate into close contact with the mask.

According to the third aspect, the present invention provides a mask plate suitably applicable to an adsorbing unit of an apparatus for mounting conductor balls on terminal pads of semiconductor devices or other electronic devices on a semiconductor wafer or other substrate, stepwise, for divisions of the substrate that include different numbers of the devices, wherein:

the mask plate is attachable to one side of an adsorbing plate attached to an adsorbing head of the adsorbing unit, the adsorbing plate having adsorbing holes for adsorbing the conductor balls, the adsorbing holes corresponding in number and position to the terminal pads present in one of the divisions that includes a largest number of the devices; and the mask plate has an opening conforming in shape and size to an area of the substrate occupied by a group of the devices included in a selected one of the divisions so that the conductor balls are only adsorbed by the adsorbing holes corresponding in position to the terminal pads of the devices of the group in the selected one division.

According to the fourth aspect, the present invention provides a process for mounting conductor balls on terminal pads of semiconductor devices or other electronic devices on a semiconductor wafer or other substrate, stepwise, for divisions of the substrate that include different numbers of the devices, the process comprising the steps of:

using an adsorbing unit which comprises:

an adsorbing head;

an adsorbing plate attached to the head and having adsorbing holes for adsorbing the conductor balls, the adsorbing holes being arranged corresponding in number and position to the terminal pads present in one of the divisions that includes a largest number of the devices; and a set of plural mask plates attachable to one side of the adsorbing plate and having respective openings different in shape and/or position corresponding to an area of the substrate occupied by a group of the devices included in a selected one of the divisions so that the conductor balls are only adsorbed by the adsorbing holes corresponding in position to the terminal pads of the devices of the group in the selected one division; and mounting the conductor balls on the terminal pads of the devices included in different ones of the divisions by exchanging one of the mask plates, attached to the one side of the adsorbing plate, with another having a different shape and/or position of the opening.

According to the fifth aspect, the present invention provides a process for mounting conductor balls on terminal pads of semiconductor devices or other electronic devices on a semiconductor wafer or other substrate, stepwise, for divisions of the substrate that include different numbers of the devices, the process comprising the steps of:

using an adsorbing unit which comprises:

an adsorbing head;

an adsorbing plate attached to the head and having adsorbing holes for adsorbing the conductor balls, the adsorbing holes being arranged to correspond in number and position to the terminal pads present in one of the divisions that includes a largest number of the devices;

a vessel for containing the conductor balls and having an open end for allowing the conductor balls to enter and exit the vessel;

a mask plate attached to the open end of the vessel and having an opening conforming in shape and size to an area of the substrate occupied by a group of the devices included in a selected one of the divisions; and a means for moving the head to bring the adsorbing plate into close contact with, or away from, the mask plate so that the conductor balls are only adsorbed by the adsorbing holes corresponding in position to the terminal pads of the devices of the group in the selected one division when the head is moved to bring the adsorbing plate into close contact with the mask; and mounting the conductor balls on the terminal pads of the devices included in different ones of the divisions by exchanging one of the mask plates, attached to the open end of the vessel, with another having a different shape and/or position of the opening.

The mask plates can be easily exchanged either if the adsorbing plate and the mask plate are detachable from the head and the mask plate is attached to an inside surface of the adsorbing plate attached to the head, or if the mask plate is attached to either an inside surface or an outside surface of the adsorbing plate fixed to the head.

It is advantageous to prepare a set of plural mask plates having the same shape and size and having respective openings different in shape and/or position from each other. This facilitates quickly exchanging a mask plate attached to the adsorbing unit with another mask plate and quickly mounting conductor balls on terminals pads of semiconductor devices present in different divisions of a substrate.

It is also advantageous that the adsorbing plate and/or the mask plate are attached to the head by vacuum adsorption of a peripheral portion thereof to the head. This facilitates quick attachment and removal of the adsorbing plate and/or the mask plate.

BRIEF DESCRIPTION OF THE DRAWINGS

FIG. 5 shows a semiconductor wafer having semiconductor devices formed therein, in (a) a general plan view and (b) an enlarged partial plan view of the portion P of (a);

FIG. 6 shows an adsorbing unit according to a preferred embodiment of the present invention, in (a) a general plan cross-sectional view and (b) an enlarged partial cross-sectional view of the portion P of (a);

FIG. 7 shows an adsorbing plate and a mask plate partially masking the adsorbing plate, in (a) a general plan view and (b) an enlarged partial plan view of the portion P of (a);

FIG. 13 shows an adsorbing unit according to a preferred embodiment of the present invention, in a cross-sectional view;

DESCRIPTION OF THE PREFERRED EMBODIMENTS

Figure 1:
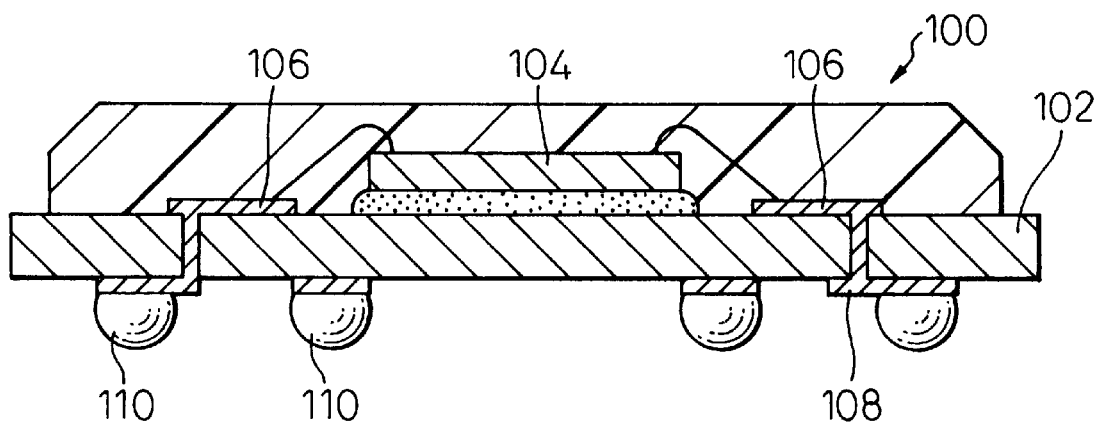
FIG. 1 shows a ball grid array (BGA) type semiconductor device, in a cross-sectional view.
Figure 2:
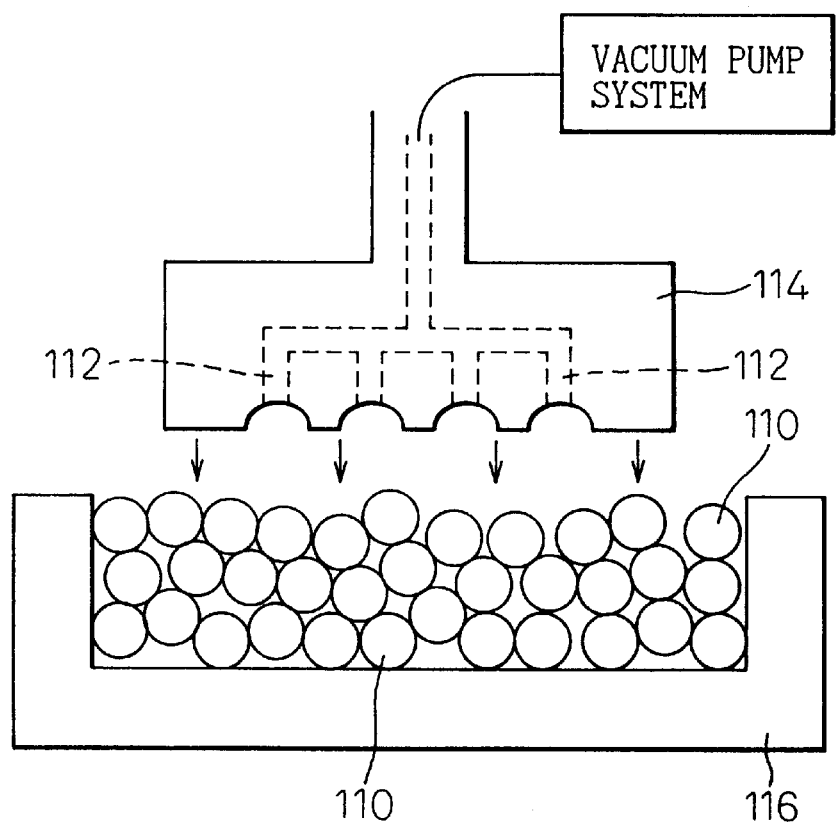
FIG. 2 shows a conventional adsorbing unit for adsorbing conductor balls to be mounted on terminal pads of semiconductor devices formed in a semiconductor wafer, when the unit is being lowered toward the balls, in a cross-sectional view.
Figure 3:
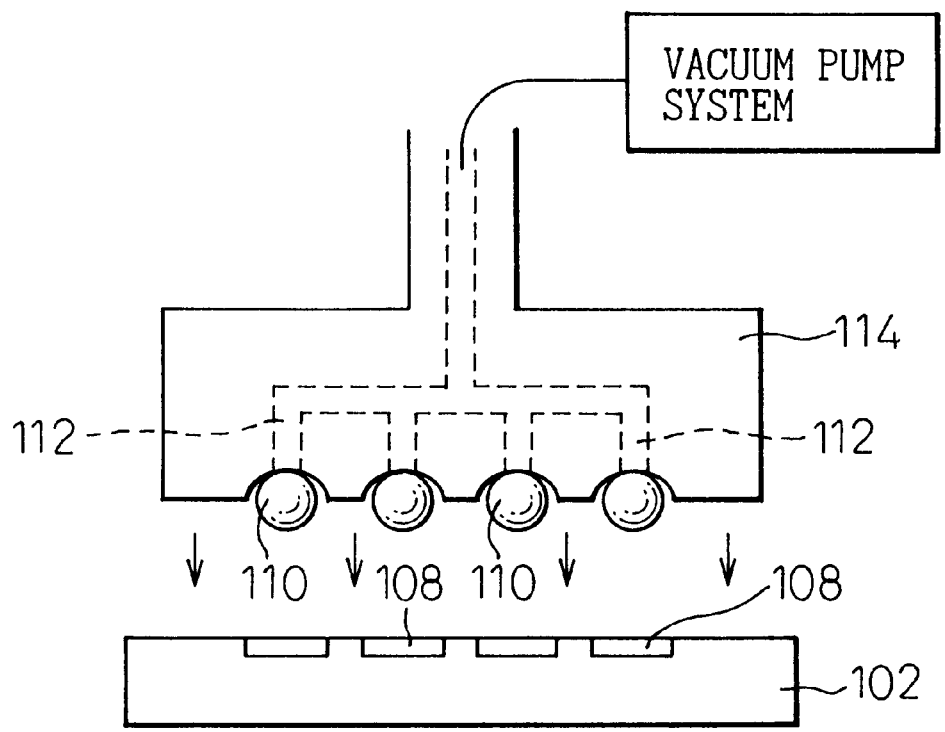
FIG. 3 shows the adsorbing unit shown in FIG. 2, when the unit adsorbs the balls, in a cross-sectional view.
Figure 4:
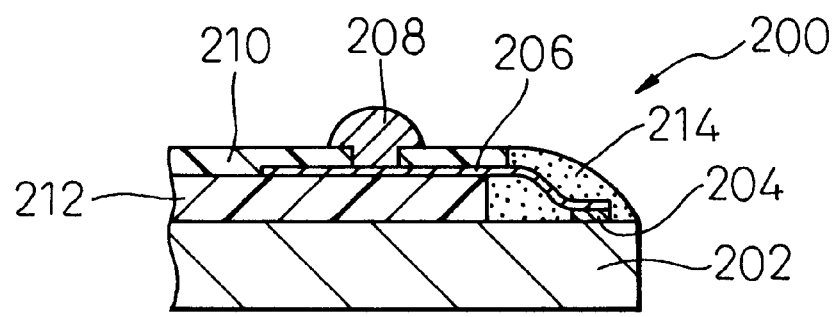
FIG. 4 shows a chip size package (CSP) in a cross-sectional view.

FIG. 6 shows an adsorbing unit, according to a preferred embodiment of the present invention, which is advantageously used for mounting solder balls 208 for forming ball form connection terminals on terminal pads of a large number of semiconductor devices 202 formed in a single semiconductor wafer 300 as shown in FIG. 5.

The adsorbing unit includes an adsorbing head 12 provided with a vacuum chamber 10 therein and an adsorbing plate 14 attached thereto. The adsorbing plate 14 defines part of the vacuum chamber 10 while providing an adsorbing surface onto which solder balls 208 adsorbed. The adsorbing plate 14 has recesses 20 corresponding to semiconductor devices 200 formed in a semiconductor wafer 300. The recesses 20 each have a bottom through which adsorbing holes 22 penetrate. The adsorbing holes 22 are arranged corresponding in number and position to terminal pads of semiconductor devices 200 of divisions 302c, 302d, 302i, and 302j of the wafer 300 that include the largest number of semiconductor devices 200.

The adsorbing head 12 also has holes 18 penetrating the upper wall thereof and connected to a vacuum pump system for evacuating the vacuum chamber 10. The vacuum pump system is operated to evacuate the vacuum chamber 10 through the holes 18 thereby adsorbing solder balls 208 to the adsorbing holes 22 of the adsorbing plate 14 with one solder ball 208 being adsorbed to one adsorbing hole 22.

The adsorbing unit shown in FIG. 6 has a mask plate 24 attached to the head 12 and in close contact with the inside surface of the adsorbing plate 14 attached to the head 12. The mask plate 24 has an opening 26 through which selected adsorbing holes 22 only are exposed to the vacuum chamber 10. The opening 26 is conformed in shape and size to an area of the semiconductor wafer 300 occupied by a group of the semiconductor devices 200 in a selected one of the divisions 302a to 302l so that the solder balls 208 are only adsorbed by the adsorbing holes 22 corresponding in position to the terminal pads of the semiconductor devices of the group in the selected one division.

The mask plate 24 having the opening 26 is attached to the head 12 by vacuum suction through the vacuum suction hole 16a formed in the side wall of the head 12. The adsorbing plate 14 is also attached to the outside surface of the mask plate 24 by vacuum suction through the vacuum suction hole 16b formed in the side wall of the head 12 and a through hole 28 formed through the mask plate 24. The adsorbing plate 14 and the mask plate 24 can be easily removed from the head 12 by freeing the vacuum suction holes 16a and 1b from evacuation. The adsorbing plate 14 alone can be easily removed from the mask plate 24 by freeing the vacuum suction hole 16b alone from evacuation.

The vacuum suction holes 16a and 16b and the vacuum chamber may be evacuated either in common or singly.

Figure 8:
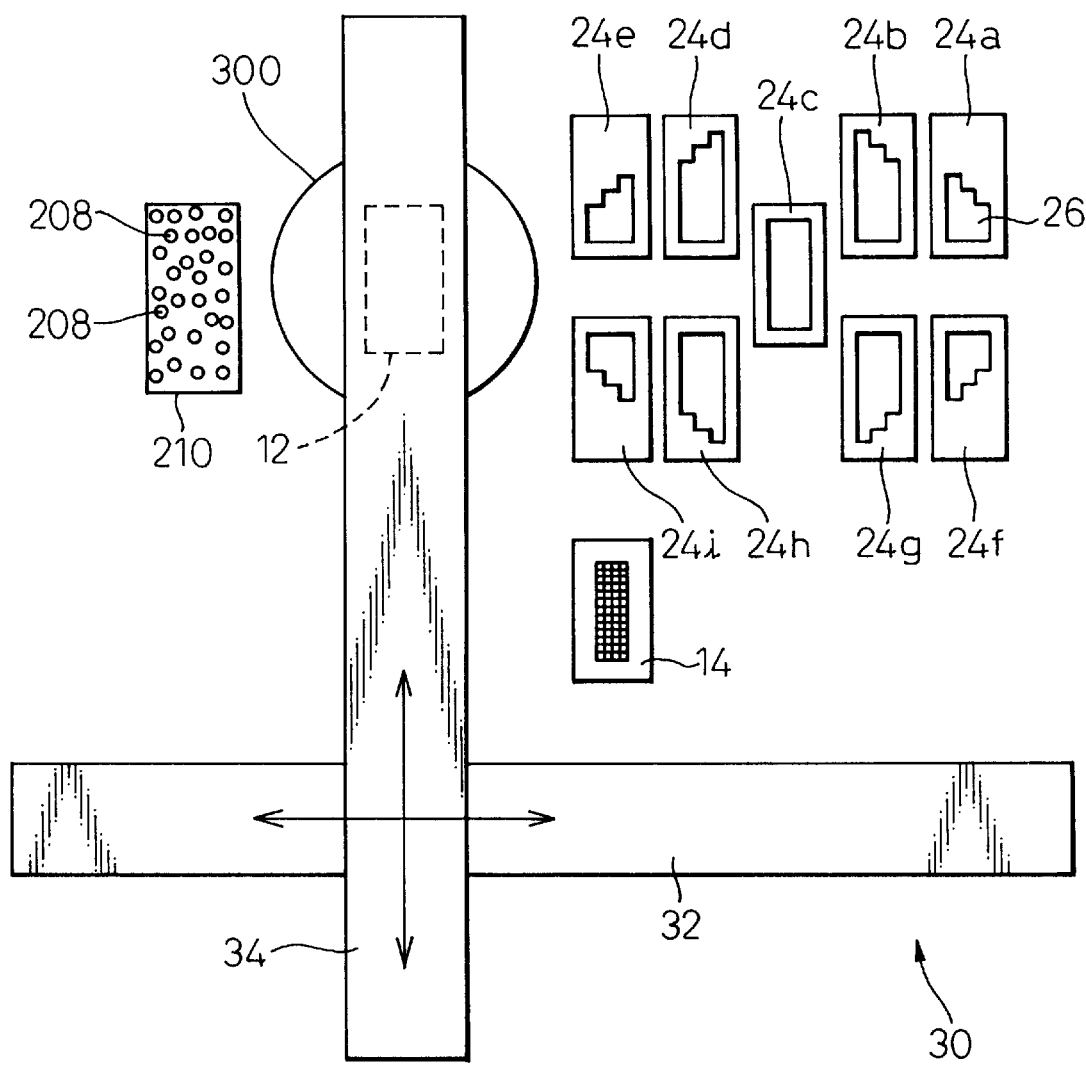
FIG. 8 shows an apparatus for mounting solder balls on terminal pads of semiconductor devices according to a preferred embodiment of the present invention, in a plan view.

FIG. 8 shows an apparatus for mounting conductor balls, such as solder balls, on terminal pads of a large number of semiconductor devices 200 formed in a semiconductor wafer 300 shown FIG. 5, by using an adsorbing unit shown in FIGS. 6 and 7. The apparatus shown in FIG. 8 has a triaxial robot 30 for moving the head 12. The triaxial robot 30 has an x-axis 32, a y-axis 34 perpendicular to the x-axis 32, and a z-axis (not shown) perpendicular to a plane defined by the x-axis 32 and the y-axis 34. The y-axis 34 can slide both parallel and perpendicular to the x-axis 32. The z-axis is also slidable with respect to the y-axis 34.

The z-axis of the triaxial robot 30 holds the head 12 and the adsorbing unit moves along the x-axis 32, the y-axis 34, and the z-axis.

The y-axis 34 may be held on a θ-axis (not shown) movable along the x-axis 32 to allow the end of the y-axis 34 to rotate around the θ-axis.

As shown in FIG. 8, mounting conductor balls, or solder balls 208, is started by first placing, in the respective predetermined positions, an adsorbing plate 14, a set of plural mask plates 24a–24j having openings 26 different in shape and position, a semiconductor wafer 300 having a large number of semiconductor devices 200 formed therein, and a vessel 210 containing a large number of solder balls 208.

The set of mask plates 24a–24j include a mask plate 24c having an opening 26 conformed in shape and size to the area of the divisions 302c, 302d, 302i and 302j, which area is occupied by a group of the semiconductor devices 200. In the same manner, the mask plate 24a corresponds to the device-occupied area of the division 302a, the mask plate 24b the division 302b, the mask plate 24f the division 302g, the mask plate 24g the division 302h, the mask plate 24h the division 302k, and the mask plate 24i the division 302l.

The solder balls 208 are suspended in the air in the vessel 210 by vibration or an air flow.

In the next step, to mount the solder balls 208 on terminal pads of the semiconductor devices 200 in the division 302a, the mask plate 204a having an opening 26 conformed in shape and size to the device-occupied area of the division 302a is attached to the head 12 of the adsorbing unit. This is effected by sliding the x-axis 32 and the y-axis 34 to move the head to above the mask plate 24a, sliding the z-axis to bring the head 12 into contact with the mask plate 24a, and evacuating a vacuum suction hole 16a formed in the side wall of the head 12 to vacuum-adsorb the peripheral portion of the mask plate 24a.

The head 12 with the mask plate 24a adsorbed thereto is moved upward until the mask plate 24a and the adsorbing plate 14 come into close contact with each other and the adsorbing plate 14 is attached to the head 12 by vacuum adsorption of the peripheral portion of the adsorbing plate 14 effected by evacuating another vacuum suction hole 16b also formed in the side wall of the head 12.

The head 12 with the mask plate 24 and the adsorbing plate 14 both adsorbed thereto is moved to above the vessel 210 containing solder balls 208 and the adsorbing unit is then operated to evacuate the vacuum chamber 10 of the head 12, thereby adsorbing solder balls to the adsorbing holes 22 with one solder ball being adsorbed to one adsorbing hole 22, in which only the selected adsorbing holes 22 exposed through the opening 26 adsorb the solder balls 208.

The head 12 is moved to above the division 302a of the wafer 300 with the solder balls 208 kept adsorbed to the selected adsorbing holes 22 of the adsorbing plate 14.

The head 12 is then lowered until the solder balls 208 adsorbed to the selected adsorbing holes 22 of the adsorbing plate 14 are brought into close contact with the corresponding terminal pads of the semiconductor devices in the division 302a.

The vacuum chamber 10 is then freed from evacuation to release the solder balls 208 onto the terminal pads, so that the solder balls 208 are mounted on terminal pads of the semiconductor devices 200 in the division 302a.

Thereafter, the head 12 is moved to a predetermined position and the vacuum suction hole 16b is freed from evacuation to release the adsorbing plate 14 from the mask plate 24a.

The head 12 is further moved to another predetermined position and the vacuum suction hole 16a is freed from evacuation to release the mask plate 24a from the head 12, thereby completing one cycle of mounting solder balls 208 for one division 302a.

The above-mentioned cycle is repeated division by division or stepwise for all divisions 302a to 302l by serially using one from the mask plates 24a to 24i to mount solder balls 208 on all terminal pads of the semiconductor devices 200 of the semiconductor wafer 300.

The terminal pads of the semiconductor devices 200 of the semiconductor wafer 300 preferably have a flux applied thereto in advance by screen printing or other suitable method.

Figure 9:
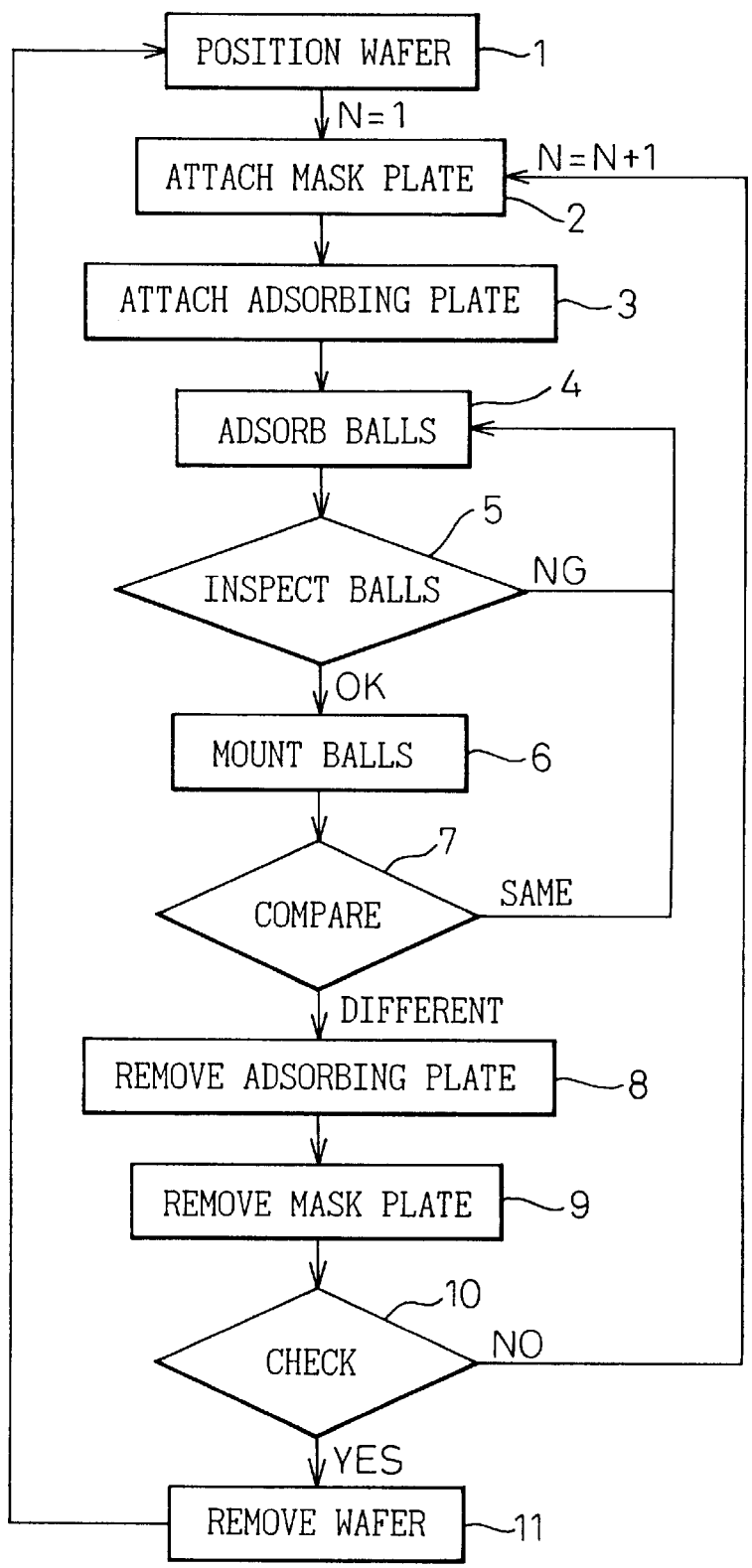
FIG. 9 is a flow chart of a process of mounting solder balls according to the present invention by using the apparatus shown in FIG. 8.

FIG. 9 is a flow chart for carrying out the above-mentioned process sequence through the following steps.

Step 1 first places in position the semiconductor wafer 300 having the semiconductor devices 200 formed therein.

Step 2 attaches a selected mask plate 24, numbered "N", to the adsorbing head 12.

Step 3 attaches the adsorbing plate 14 to the mask plate 24.

Step 4 adsorbs the solder balls 208 to the adsorbing holes 22.

Step 5 inspects the solder balls 208 on the adsorbing holes 22. If any hole 22 having no ball 208 adsorbed thereto is found (NG), the head 12 is returned to above the vessel 210 containing solder balls 208 where solder balls 208 are again adsorbed to the adsorbing holes 22 from the vessel 210.

Step 6 mounts the solder balls 208 onto terminal pads of the semiconductor or other electronic devices in one of the divisions 302a to 302l of the wafer 300.

Step 7 compares the shape and size of the device-occupied area between the present division 302p and the next division 302n. If the shapes and sizes are same for the two divisions, the head 12 free of solder balls 208 is returned to above the vessel 210 and solder balls 208 are adsorbed to the adsorbing holes 22 from the vessel 210, followed by steps 5 and 6. If the shapes and sizes are different between the two divisions, the process proceeds to the next step.

Step 8 removes the adsorbing plate 14 from the head 12.

Step 9 removes the mask plate 24 from the head 12.

Step 10 checks whether or not solder balls 208 are mounted in all divisions 302 of one wafer 300. If the wafer 300 contains any division 302 having no solder balls 208 mounted thereon, the process is returned to step 2 for attaching a new mask 24, numbered "N+1", to the head 12. Steps 2 to 10 are repeated until all divisions 302 get provided with the solder balls 208 mounted on terminal pads. The process then proceeds to the next step.

Step 11 removes the semiconductor device 300 from the process line.

By repeating the process sequence including steps 1 to 11, the necessary number of semiconductor wafers 300 are provided with the solder balls 208 mounted on terminal pads of semiconductor devices for all divisions 302.

Figure 10:
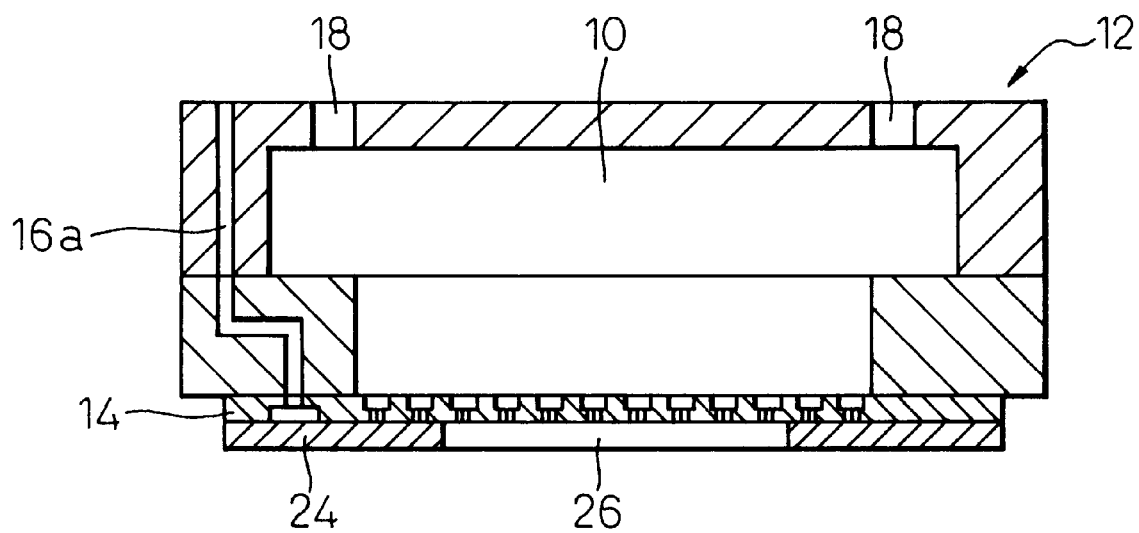
FIG. 10 shows an adsorbing unit according to another preferred embodiment of the present invention, in a cross-sectional view.

According to another preferred embodiment of the present invention, FIG. 10 shows an adsorbing unit conveniently applicable to adsorbing solder balls 208 having a larger diameter. An adsorbing plate 14 is fixed to an adsorbing head 12 and a mask plate 24 is attached to the outside surface of the adsorbing plate 14. The adsorbing unit advantageously has a simplified structure because vacuum suction is only necessary for vacuum adsorption of the peripheral portion of the mask plate 24 through a vacuum suction hole 16a.

The mask plate 24 may be removably attached to the inside surface of the adsorbing plate 14 fixed to the head 12 in a manner such that the mask plate 24 is slided through a gas-sealed silt penetrating through the side wall of the head 12 for attachment and removal. To facilitate attachment and removal, the mask plate 24 may be advantageously formed with an end protruding outward from the side wall of the head in the attached position.

Figure 11:
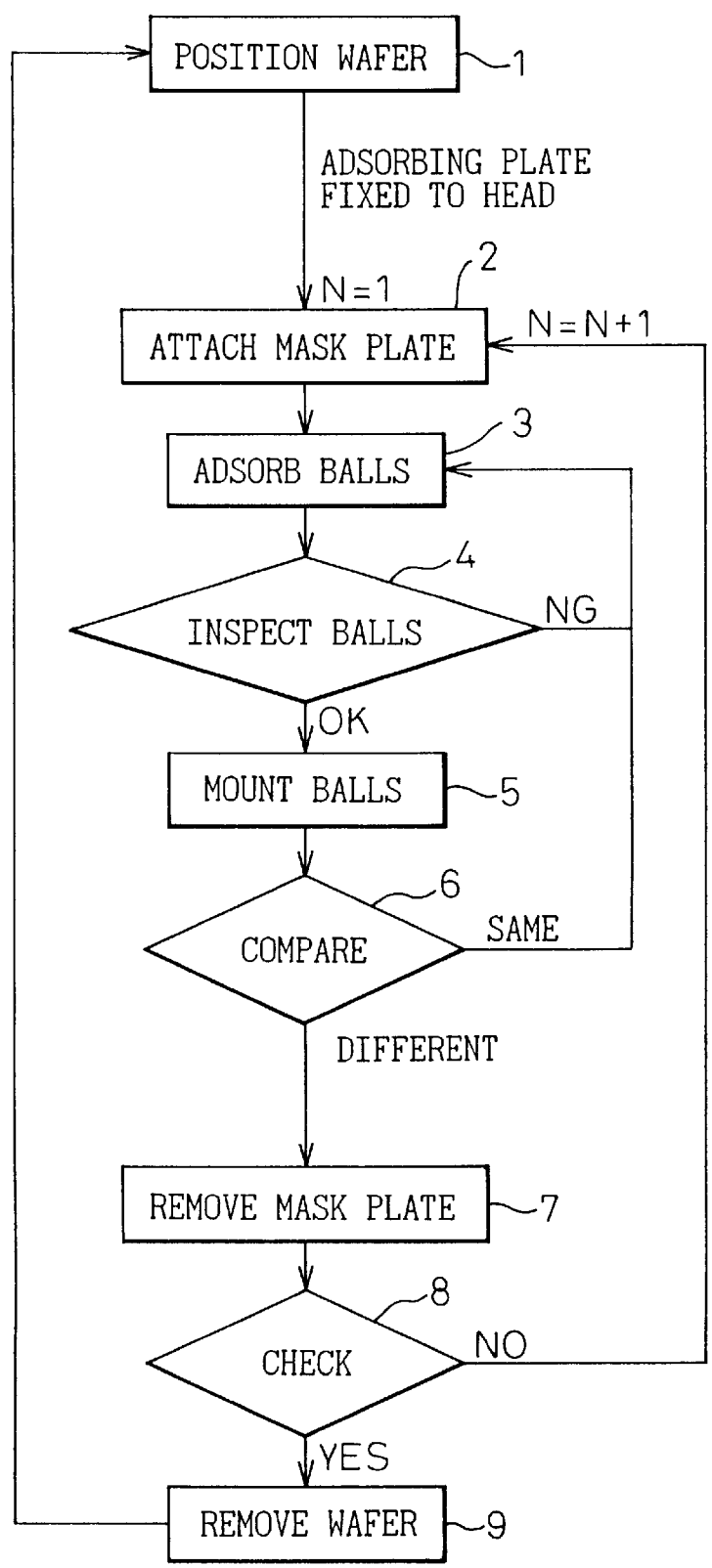
FIG. 11 is a flow chart of a process of mounting solder balls according to the present invention by using the adsorbing unit shown in FIG. 10.

FIG. 11 is a flow chart for carrying out the process of mounting conductor balls by using the adsorbing unit of FIG. 10.

Step 1 first places in position the semiconductor wafer 300 having the semiconductor devices 200 formed therein.

Step 2 attaches a selected mask plate 24, numbered "N", to the adsorbing head 12 having an adsorbing plate 14 fixed thereto.

Step 3 adsorbs the solder balls 208 to the adsorbing holes 22.

Step 4 inspects the solder balls 208 on the adsorbing holes 22. If any hole 22 having no ball 208 adsorbed thereto is found (NG), the head 12 is returned to above the vessel 210 containing solder balls 208 where the solder balls 208 are cleared off from the head 12 and solder balls 208 are again adsorbed to the adsorbing holes 22 from the vessel 210.

Step 5 mounts the solder balls 208 onto terminal pads of the semiconductor or other electronic devices in one of the divisions 302a to 302l of the wafer 300.

Step 6 compares the shape and size of the device-occupied area between the present division 302p and the next division 302n. If the shapes and sizes are same for the two divisions, the process is returned to step 3, i.e., the head 12 free of solder balls 208 is returned to above the vessel 210 and solder balls 208 are adsorbed to the adsorbing holes 22 from the vessel 210, followed by steps 4 and 5. If the shapes and sizes are different between the two divisions, the process proceeds to the next step.

Step 7 removes the mask plate 24 from the head 12.

Step 8 checks whether or not solder balls 208 are mounted in all divisions 302 of one wafer 300. If the wafer 300 contains any division 302 having no solder balls 208 mounted thereon, the process is returned to step 2 for attaching a new mask 24, numbered "N+1", to the head 12. Steps 2 to 10 are repeated until all divisions 302 get provided with the solder balls 208 mounted on terminal pads. The process then proceeds to the next step.

Step 9 removes the semiconductor device 300 from the process line.

By repeating the process sequence including steps 1 to 9, the necessary number of semiconductor wafers 300 are provided with the solder balls 208 mounted on terminal pads of semiconductor devices for all divisions 302.

Figure 12:
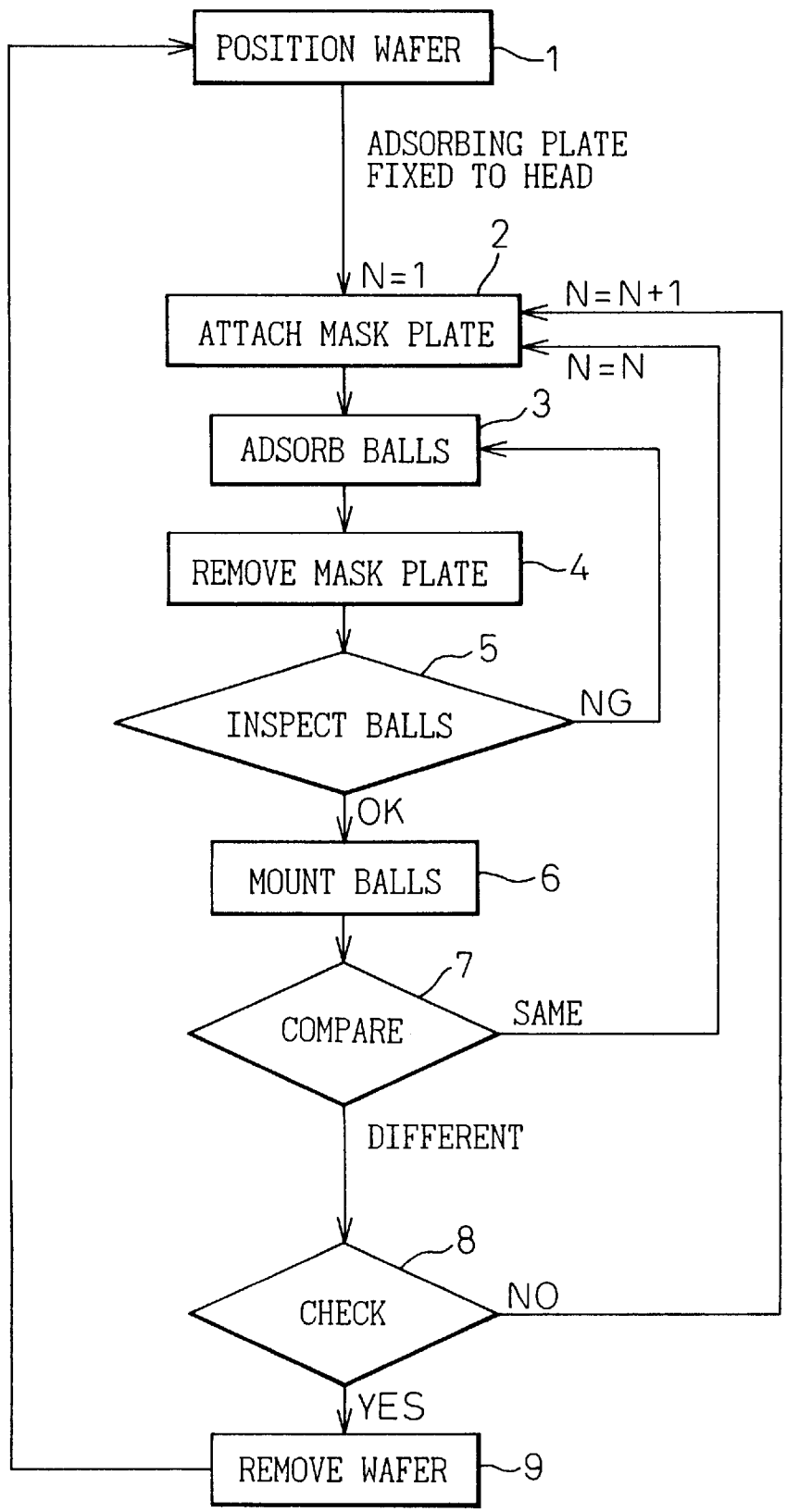
FIG. 12 is also a flow chart of a process of mounting solder balls according to the present invention by using the adsorbing unit shown in FIG. 10.

The process sequence shown in FIG. 11 can be modified as shown in FIG. 12, in which the mask plate 24, numbered "N", is removed in step 4 before mounting the conductor balls 208 and the process is returned to step 2 in which the same mask plate 24, numbered "N", is attached again before adsorption of the conductor balls 208 for the next mounting. The modified process sequence can be advantageously adopted when the mask plate 24 attached to the outside surface of the adsorbing plate 14 will obstruct mounting of the conductor balls 208 onto the terminal pads.

According to a still another preferred embodiment of the present invention, FIG. 13 shows an adsorbing unit including a vessel 210 containing solder balls 208 and having an open end provided with a mask plate 24 attached thereto. An adsorbing plate 14 is attached to an adsorbing head 12, which is moved to above the vessel 210 and is then lowered until the adsorbing plate 14 is brought into close contact with the mask plate 24 to allow the solder balls 208 contained in the vessel to be only adsorbed to the adsorbing holes 22 exposed through the opening 26 of the mask plate 24.

This embodiment does not require attachment and removal of the mask plate 24 to and from the adsorbing head 12 and advantageously reduces the process time because the mask plate 24 can be more easily attached to, or removed from, the open end of the vessel 210 without evacuation necessary for vacuum adsorption of the mask plate 24 to the head 12.

FIG. 13 shows the mask plate 24 removably attached to the open end of the vessel 210 by being mounted on a mount shoulder 25 formed along the inner wall of the vessel 210.

Figure 14:
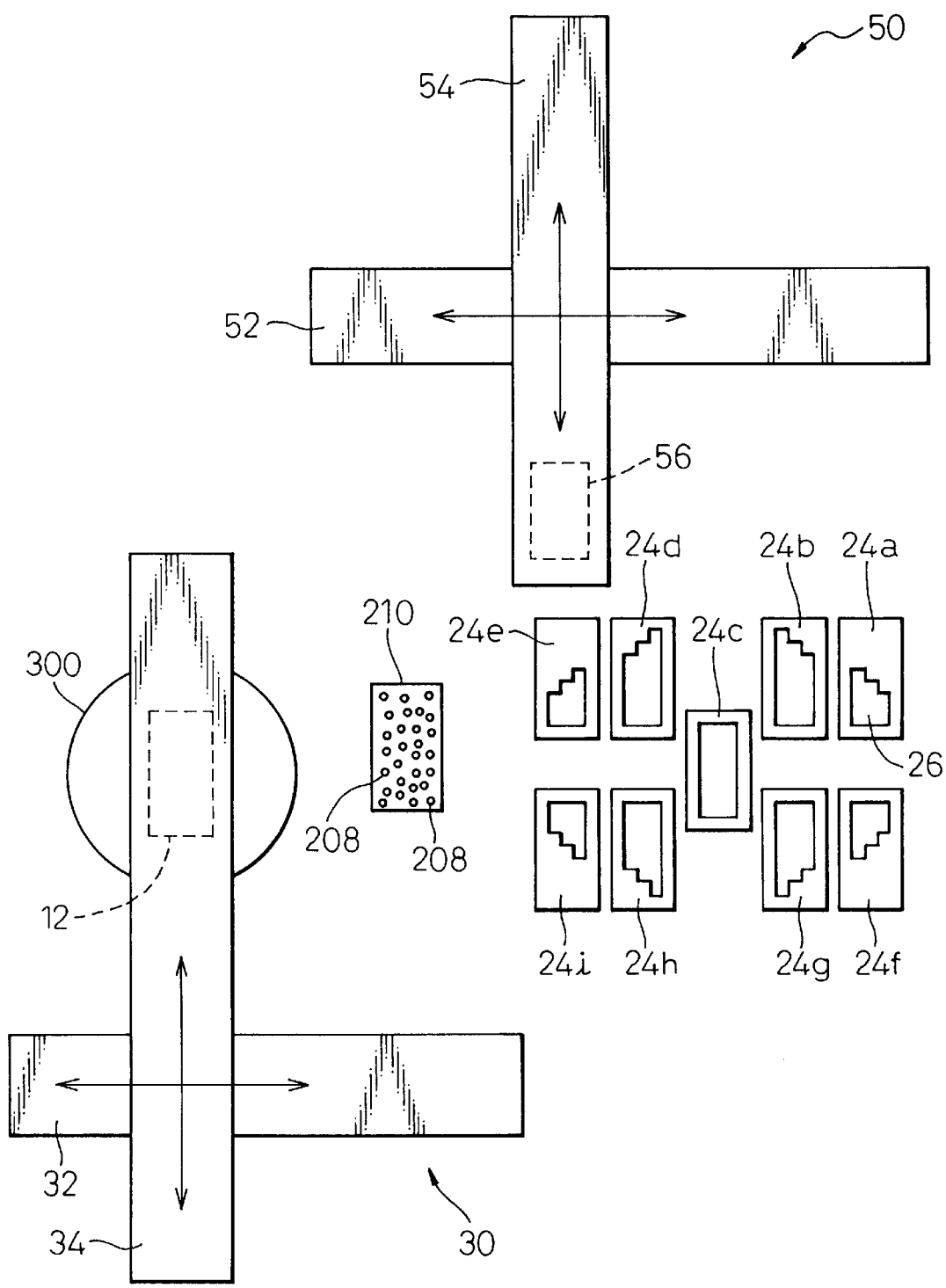
FIG. 14 shows an apparatus for mounting solder balls on terminal pads of semiconductor devices according to a preferred embodiment of the present invention, in a plan view.
Figure 15:
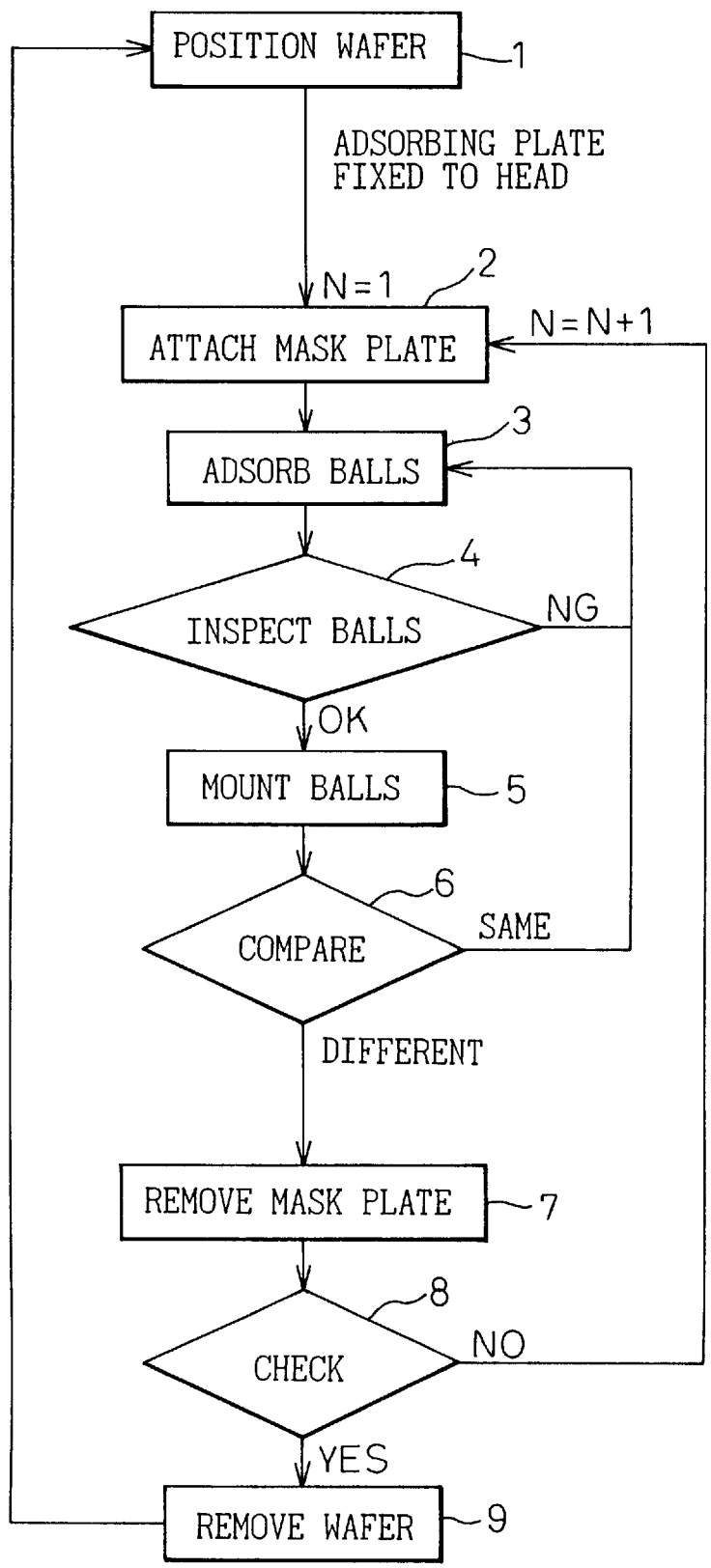
FIG. 15 is a flow chart of a process of mounting solder balls according to the present invention by using the apparatus shown in FIG. 14.

FIG. 14 shows an apparatus for mounting solder balls 208 on terminal pads of the semiconductor devices formed in a semiconductor wafer 300 shown in FIG. 5 by using the adsorbing unit shown in FIG. 13.

In addition to a triaxial robot 30 for moving the head 12 of the adsorbing unit, the apparatus of FIG. 14 also includes a mask mounter 50 for mounting a necessary one, from among the mask plates 24a to 24i, on the mount shoulder 25 of the vessel 210 and removing the mounted mask plate 24 from the mount shoulder 25.

The mask mounter 50 is also a triaxial robot having an x-axis 52, a y-axis 54 perpendicular to the x-axis 52, and a z-axis (not shown) perpendicular to a plain defined by the x-axis 52 and the y-axis 54. The y-axis 54 can slide both parallel and perpendicular to the x-axis 52. The z-axis is also slidable with respect to the y-axis 54.

The z-axis of the triaxial robot 50 is provided with a holding unit 56 for holding the mask plate 24 and the holding unit 56 moves along the x-axis 52, the y-axis 54, and the z-axis. The holding unit 56 includes a vacuum adsorption means or other means for removably adsorbing the mask plate 24.

The process of mounting conductor balls or solder balls 208 is started by first placing, in the respective predetermined positions, a set of plural mask plates 24a–24j having openings 26 different in shape and position, a semiconductor wafer 300 having a large number of semiconductor devices 200 formed therein, and a vessel 210 containing a large number of solder balls 208 suspended in the air by vibration or an air flow.

The mask plates 24a–24j correspond to the divisions 302a–302l in the same combination as described previously.

In the next step, to mount the solder balls 208 on terminal pads of the semiconductor devices 200 in the division 302a, the mask plate 24a having an opening 26 conformed in shape and size to the device-occupied area of the division 302a is attached to the open end of the vessel 210 by the mask mounter 50. This is effected by sliding the y-axis 54 of the mask mounter 50 to move the vacuum adsorption means of the holding unit 56 to above the mask plate 24a, and then sliding the z-axis to bring the vacuum adsorption means into contact with the mask plate 24a to hold the mask plate 24a.

The holding unit 56 with the mask plate 24a held thereby is moved along the x-axis 52, the y-axis 54 and the z-axis to above the vessel 210 containing the solder balls 208. The holding unit 56 is lowered to bring the mask plate 24a onto the mount shoulder 25 and the vacuum adsorption means of the holding unit 56 is freed from evacuation to mount the mask plate 24a on the mount shoulder 25.

Thereafter, the triaxial robot 30 is operated to slide the y-axis 34 and the z-axis until the adsorbing plate 14 attached to the head 12 is brought into contact with the mask plate 24a mounted on the open end of the vessel 210, followed by evacuation to cause the solder balls 208 to be adsorbed only to the selected adsorbing holes 22 exposed through the opening 26 of the mask plate 24a.

The head 12 is moved to above the division 302a of the wafer 300 with the solder balls 208 kept adsorbed to the selected adsorbing holes 22 of the adsorbing plate 14.

The head 12 is then lowered until the solder balls 208 adsorbed to the selected adsorbing holes 22 of the adsorbing plate 14 are brought into close contact with the corresponding terminal pads of the semiconductor devices in the division 302a.

The vacuum chamber 10 is then freed from evacuation to release the solder balls 208 onto the terminal pads, so that the solder balls 208 are mounted on terminal pads of the semiconductor devices 200 in the division 302a.

The mask mounter 50 is then operated in a sequence reverse to that of mounting the mask plate 24a on the open end of the vessel 210 to remove the mask plate 24a from the vessel 210, thereby completing one cycle of mounting solder balls 208 for one division 302a.

The above-mentioned cycle is repeated division by division, or stepwise, for all divisions 302a to 302l by serially using one from the mask plates 24a to 24i to mount solder balls 208 on all terminal pads of the semiconductor devices 200 of the semiconductor wafer 300.

The terminal pads of the semiconductor devices 200 of the semiconductor wafer 300 preferably have a flux applied thereto in advance by screen printing or another suitable method.

The present invention is not only applicable to the herein-described semiconductor wafer but is also advantageously applicable to other substrates such as a substrate having an electronic circuit formed therein to be suitably used as a BGA type semiconductor device as shown in FIG. 1, when mounting conductor balls on terminal pads of a large number of electronic parts or devices formed in the substrate.

The present invention is also applicable to mounting conductor balls on terminal pads of a large number of electronic devices such as circuit boards collectively formed on a single substrate such as a resin panel.

What is claimed is:

1. An apparatus for mounting conductor balls on terminal pads of semiconductor devices or other electronic devices on a semiconductor wafer or other substrate, stepwise for divisions of the substrate that include different numbers of the devices, the apparatus including an adsorbing unit which comprises:

an adsorbing head;

an adsorbing plate attached to the head and having adsorbing holes for adsorbing the conductor balls, the adsorbing holes being arranged corresponding in number and position to the terminal pads present in one of the divisions that includes a largest number of the devices; and a mask plate attached to one side of the adsorbing plate and having an opening conformed in shape and size to an area of the substrate occupied by a group of the devices included in a selected one of the divisions so that the conductor balls are only adsorbed by the adsorbing holes corresponding in position to the terminal pads of the devices of the group in the selected one division.

2. An apparatus according to claim 1, wherein the adsorbing plate and the mask plate are detachable from the head and the mask plate is attached to an inside surface of the adsorbing plate attached to the head.

3. An apparatus according to claim 1, wherein the mask plate is attached to either an inside surface or an outside surface of the adsorbing plate fixed to the head.

4. An apparatus according to any one of claims 1 to 3, wherein the adsorbing plate and/or the mask plate are attached to the head by vacuum adsorption of a peripheral portion thereof to the head.

5. An apparatus for mounting conductor balls on terminal pads of semiconductor devices or other electronic devices on a semiconductor wafer or other substrate, stepwise, for divisions of the substrate that include different numbers of the devices, the apparatus including an adsorbing unit which comprises:

an adsorbing head;

an adsorbing plate attached to the head and having adsorbing holes for adsorbing the conductor balls, the adsorbing holes being arranged corresponding in number and position to the terminal pads present in one of the divisions that includes a largest number of the devices;

a vessel for containing the conductor balls and having an open end for allowing the conductor balls to enter and exit the vessel;

a mask plate attached to the open end of the vessel and having an opening conformed in shape and size to an area of the substrate occupied by a group of the devices included in a selected one of the divisions; and a means for moving the head to bring the adsorbing plate into close contact with, or away from, the mask plate so that the conductor balls are only adsorbed by the adsorbing holes corresponding in position to the terminal pads of the devices of the group in the selected one division when the head is moved to bring the adsorbing plate into close contact with the mask.

6. A mask plate suitably applicable to an adsorbing unit of an apparatus for mounting conductor balls on terminal pads of semiconductor devices or other electronic devices on a semiconductor wafer or other substrate, stepwise for divisions of the substrate that include different numbers of the devices, wherein:

the mask plate is attachable to one side of an adsorbing plate attached to an adsorbing head of the adsorbing unit, the adsorbing plate having adsorbing holes for adsorbing the conductor balls, the adsorbing holes corresponding in number and position to the terminal pads present in one of the divisions that includes a largest number of the devices; and the mask plate has an opening conformed in shape and size to an area of the substrate occupied by a group of the devices included in a selected one of the divisions so that the conductor balls are only adsorbed by the adsorbing holes corresponding in position to the terminal pads of the devices of the group in the selected one division.

7. A set of plural mask plates each according to claim 6, wherein the mask plates have the same shape and size and have respective openings different in shape and/or position from each other.

* * * * *